US010370762B2

(12) United States Patent
Moffatt

(10) Patent No.: US 10,370,762 B2
(45) Date of Patent: Aug. 6, 2019

(54) APPARATUS AND METHODS FOR PHOTO-EXCITATION PROCESSES

(71) Applicant: Applied Materials, Inc., Santa Clara, CA (US)

(72) Inventor: Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/359,090

(22) Filed: Nov. 22, 2016

(65) Prior Publication Data

US 2018/0274099 A1    Sep. 27, 2018

Related U.S. Application Data

(62) Division of application No. 14/186,837, filed on Feb. 21, 2014, now Pat. No. 9,499,909.
(Continued)

(51) Int. Cl.
*H01L 21/00* (2006.01)
*C23C 16/48* (2006.01)
(Continued)

(52) U.S. Cl.
CPC ............ *C23C 16/483* (2013.01); *C23C 16/28* (2013.01); *C23C 16/45504* (2013.01);
(Continued)

(58) Field of Classification Search
CPC ................................................ H01L 21/02521
See application file for complete search history.

(56) References Cited

U.S. PATENT DOCUMENTS 3,271,180 A    9/1966  White
4,340,617 A    7/1982  Deutsch et al.
(Continued)

FOREIGN PATENT DOCUMENTS

CN    1625707 A    6/2005
EP    0306069 A2   3/1989
(Continued)

OTHER PUBLICATIONS

International Search Report and Written Opinion dated Jul. 17, 2014 for Application No. PCT/US20141018090.
(Continued)

*Primary Examiner* — Mounir S Amer
*Assistant Examiner* — Alexander Belousov
(74) *Attorney, Agent, or Firm* — Patterson + Sheridan, LLP

(57) ABSTRACT

Embodiments of the disclosure provide a method and apparatus for depositing a layer on a substrate. In one embodiment, the method includes exposing a surface of the substrate disposed within a processing chamber to a fluid precursor, directing an electromagnetic radiation generated from a radiation source to a light scanning unit such that the electromagnetic radiation is deflected and scanned across the surface of the substrate upon which a material layer is to be formed, and initiating a deposition process with the electromagnetic radiation having a wavelength selected for photolytic dissociation of the fluid precursor to deposit the material layer onto the surface of the substrate. The radiation source may comprise a laser source, a bright light emitting diode (LED) source, or a thermal source. In one example, the radiation source is a fiber laser producing output in the ultraviolet (UV) wavelength range.

13 Claims, 4 Drawing Sheets

Related U.S. Application Data

(60) Provisional application No. 61/791,041, filed on Mar. 15, 2013.

(51) Int. Cl.

| | |
|---|---|
| C30B 25/02 | (2006.01) |
| C23C 16/28 | (2006.01) |
| C23C 16/455 | (2006.01) |
| C30B 25/16 | (2006.01) |
| C30B 30/00 | (2006.01) |
| H01L 21/02 | (2006.01) |

(52) U.S. Cl.
CPC ............ *C30B 25/02* (2013.01); *C30B 25/165* (2013.01); *C30B 30/00* (2013.01); *H01L 21/0262* (2013.01); *H01L 21/02521* (2013.01)

(56) References Cited

U.S. PATENT DOCUMENTS

| | | | |
|---|---|---|---|
| 4,748,045 A | 5/1988 | Ehrlich et al. | |
| 4,843,030 A | 6/1989 | Eden et al. | |
| H1264 H | 12/1993 | Epler et al. | |
| 5,306,447 A | 4/1994 | Marcus et al. | |
| 5,482,739 A | 1/1996 | Hey et al. | |
| 5,650,361 A | 7/1997 | Radhakrishnan | |
| 5,786,023 A * | 7/1998 | Maxwell | C23C 16/4418 264/40.1 |
| 5,828,481 A | 10/1998 | Cobb et al. | |
| 5,999,673 A | 12/1999 | Valentin et al. | |
| 6,278,809 B1 | 8/2001 | Johnson et al. | |
| 6,324,326 B1 | 11/2001 | Dejneka et al. | |
| 6,788,445 B2 * | 9/2004 | Goldberg | B41J 2/473 347/250 |
| 7,976,634 B2 | 7/2011 | Carlson et al. | |
| 2006/0258124 A1 | 11/2006 | Singh et al. | |
| 2007/0232031 A1 | 10/2007 | Singh et al. | |
| 2008/0068689 A1 | 3/2008 | Saisho et al. | |
| 2008/0176383 A1 | 7/2008 | Tanaka et al. | |
| 2008/0278566 A1 | 11/2008 | Towner et al. | |
| 2010/0320171 A1 | 12/2010 | Mao et al. | |
| 2013/0109122 A1 | 5/2013 | Moffatt | |

FOREIGN PATENT DOCUMENTS

| | | |
|---|---|---|
| JP | 07012056 | 2/1995 |
| JP | 2004153188 A | 5/2004 |
| JP | 2005019492 A | 1/2005 |
| JP | 2010092952 A | 4/2010 |
| KR | 1020100027270 | 3/2010 |

OTHER PUBLICATIONS

Non-Final Office Action for U.S. Appl. No. 14/186,837 dated Oct. 9, 2015.
Final Office Action for U.S. Appl. No. 14/186,837 dated Mar. 25, 2016.
Search Report for Chinese Application No. 2014800115732 dated Mar. 25, 2017.
Bhuiyan et al., Laser-Assisted Metalorganic Vapor-Phase Epitaxy (LMOVPE) of Indium Nitride (InN), Phys. Stat. Sol. (a), 19, No. 2, (2002) pp. 502-505.
Taiwan Office Action dated Jan. 4, 2019 for Application No. 106122326.

* cited by examiner

APPARATUS AND METHODS FOR PHOTO-EXCITATION PROCESSES

CROSS-REFERENCE TO RELATED APPLICATIONS

This application is a divisional of U.S. patent application Ser. No. 14/186,837, filed Feb. 21, 2014, which claims benefit of U.S. Provisional Patent Application Ser. No. 61/791,041, filed Mar. 15, 2013, which is herein incorporated by reference

BACKGROUND

Field

Embodiments of the disclosure generally relate to methods of thermally processing substrates, and more particularly to methods of depositing a layer on a substrate.

Description of the Related Art

Semiconductor manufacturing relies on chemical processes to deposit, remove, clean, and otherwise transform materials formed on a substrate. These processes typically occur in a reactor that applies thermal or electrical energy to accelerate the chemical processes. In some cases, low energy photons are used to add thermal energy. In other cases, higher energy photons are used to dissociate molecules before they enter the reactor. In still other cases, higher energy photons are used to transform materials on a substrate.

For the very shallow circuit features required for advanced integrated circuits, it is greatly desired to reduce the total thermal budget in achieving the required thermal processing. The thermal budget may be considered as the total time at high temperatures necessary to complete device fabrication. The greater the total time that the substrate is subject to high temperatures, the more features such as implanted junctions may lose their definition due to diffusion or migration of atoms. However, the conventional approaches of activating chemical processes for semiconductor applications are typically energy-intensive and therefore are not suitable for most device fabrication. For example, substrates for CMOS devices typically have a temperature threshold at about 400° C. Furthermore, even at higher temperatures, current CVD, ALD or epitaxial process still requires long deposition times, which undesirably reduce the throughput.

Therefore, there is a need for an improved apparatus and methods for a substrate process that promotes low temperature depositions at faster processing time.

SUMMARY OF THE DISCLOSURE

A photonic-based apparatus and methods for photo-excited process reactions such as epitaxy, CVD, and ALD are disclosed. The concept of the disclosure may benefit processes that may require at least one "LASE" application, e.g., applications using electromagnetic radiation such as laser ("L"), using electromagnetic radiation to activate or assist activation ("A"), using electromagnetic radiation to perform processes on surface or selective processing of an object ("S"), using electromagnetic radiation to perform epitaxy or etch process ("E").

In one embodiment, a method for depositing a layer on a substrate is disclosed. The method includes exposing a surface of the substrate disposed within a processing chamber to a fluid precursor, directing an electromagnetic radiation generated from a radiation source to a light scanning unit such that the electromagnetic radiation is deflected and scanned across the surface of the substrate upon which a material layer is to be formed, and initiating a deposition process with the electromagnetic radiation having a wavelength selected for photolytic dissociation of the fluid precursor to deposit the material layer onto the surface of the substrate. The radiation source may comprise a laser source, a bright light emitting diode (LED) source, or a thermal source. In one example, the radiation source is a fiber laser producing output in the ultraviolet (UV) wavelength range.

In another embodiment, the method includes flowing a fluid precursor radially across a surface of the substrate disposed within a processing chamber in a laminar manner so that the surface of the substrate is immersed in the fluid precursor, directing an electromagnetic radiation generated from a radiation source to a light scanning unit such that the electromagnetic radiation is deflected and scanned, in a predetermined shape of illumination, across the substrate at or near the surface upon which a material layer is to be formed, and initiating a deposition process with the electromagnetic radiation having a wavelength selected for photolytic dissociation of the fluid precursor to deposit the material layer onto the surface of the substrate.

In yet another embodiment, a substrate processing chamber is provided. The processing chamber includes a substrate support for supporting a substrate within the processing chamber, a gas supply providing a fluid precursor into the processing chamber, and a radiation source emitting an electromagnetic radiation to the fluid precursor at or near a surface of the substrate, the electromagnetic radiation having a wavelength and a power level selected for photolytic dissociation of the fluid precursor to deposit a material layer onto the surface of the substrate. The processing chamber may further include a light scanning unit configured to direct the electromagnetic radiation from the radiation source to scan across the surface of the substrate. Details of the disclosure are discussed below with respect to FIGS. 1A-1B, 2 and 3.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally use a radiation source which projects a beam of light having a desired coherency onto a scanning unit, which deflects the light or electromagnetic radiation in a desired shape of image, such as a square or a rectangular shape that is sufficient to cover a portion or entire portion of a surface of the substrate in a longitudinal or transversal direction. The light or electromagnetic radiation has a wavelength and power selected to photo-dissociate a gaseous or liquid precursor at or near the substrate surface for effective deposition of a material layer on the surface of the substrate. In one example, the deposition is performed at a lower temperature less than 400° C. through a substantially photolytic, non-thermal dissociation process using fiber lasers in the ultraviolet (UV) wavelength range.

Exemplary Hardware

Figure 1A:
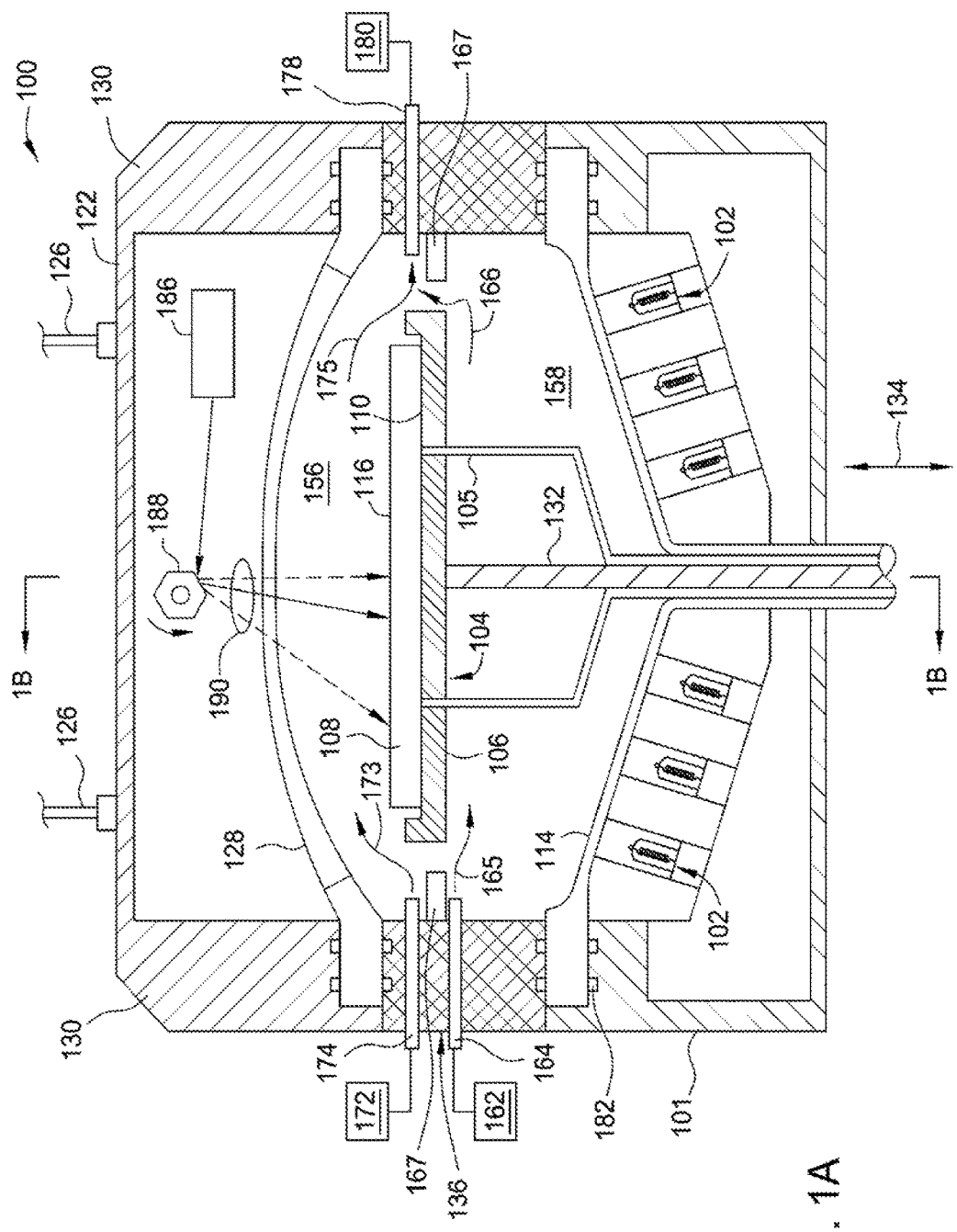
FIG. 1A illustrates a schematic sectional view of an exemplary thermal processing chamber that may be used to practice embodiments of the present disclosure.
Figure 1B:
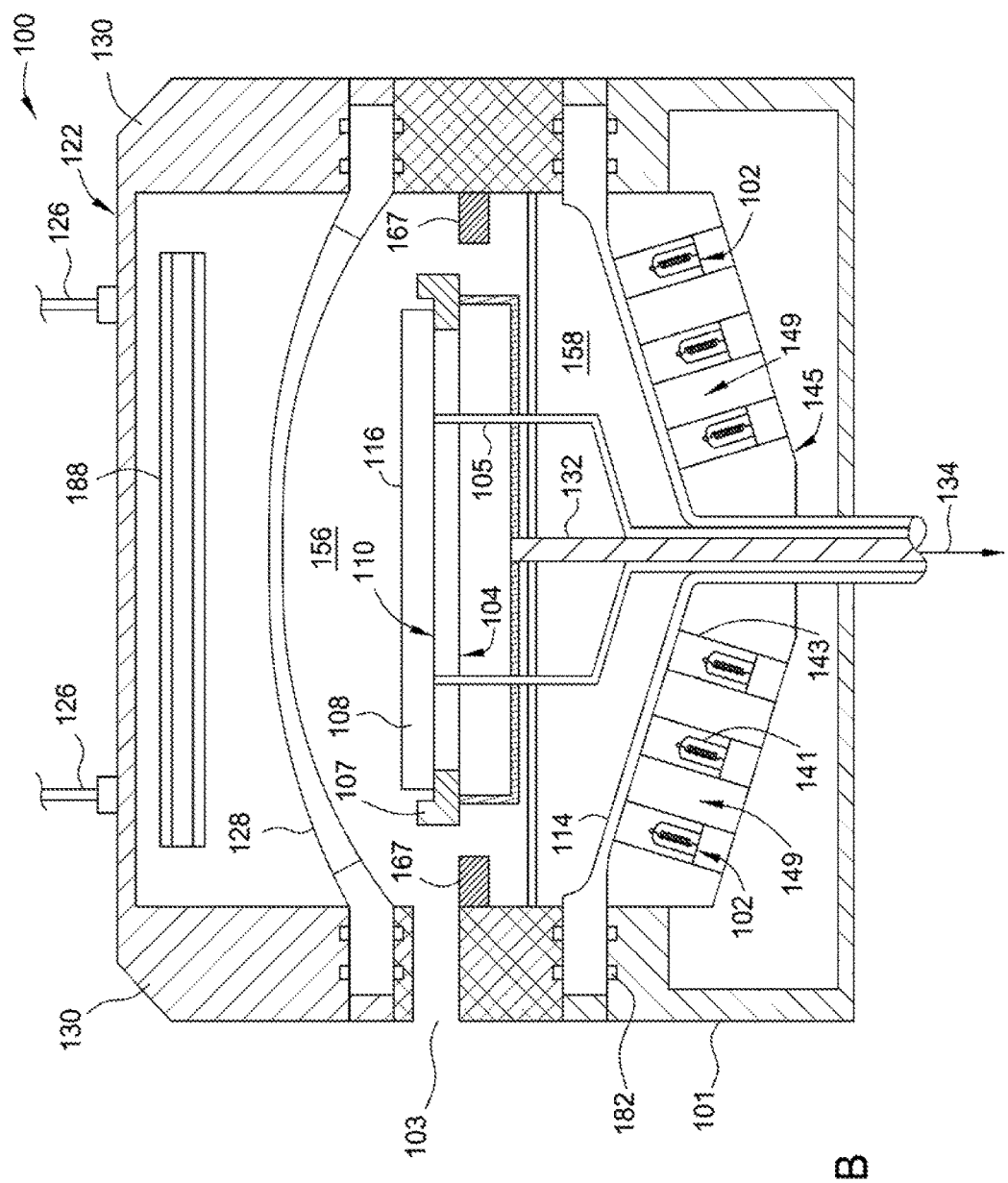
FIG. 1B illustrates a schematic side view of the process chamber taken along line 1B-1B in FIG. 1A.

FIG. 1A illustrates a schematic sectional view of an exemplary thermal processing chamber 100 that may be used to practice embodiments of the present disclosure. FIG. 1B illustrates a schematic side view of the process chamber 100 taken along line 1B-1B in FIG. 1A. The thermal processing chamber 100 may be used to perform an epitaxial deposition process, for example an epitaxial silicon deposition process. However, the methods and concept of the present disclosure may also be utilized in other processing chambers for performing other processes such as a chemical vapor deposition (CVD) process, an atomic layer deposition (ALD) process, or an atomic layer epitaxy (ALE) process.

The process chamber 100 may be used to process one or more substrates, including the deposition of a material on an upper surface of a substrate 108. The process chamber 100 generally includes an array of radiant heating lamps 102 for heating, among other components, a back side 104 of a substrate support 106 disposed within the process chamber 100. The substrate support 106 may be a disk-like substrate support 106 as shown, or may be a ring-like substrate support 107 with no central opening as shown in FIG. 1B, which supports the substrate from the edge of the substrate to facilitate exposure of the substrate to the thermal radiation of the lamps 102.

The substrate support 106 is located within the process chamber 100 between an upper dome 128 and a lower dome 114. The upper dome 128 and the lower dome 114, along with a base ring 136 that is disposed between the upper dome 128 and lower dome 114, generally define an internal region of the process chamber 100. The substrate 108 (not to scale) can be brought into the process chamber 100 and positioned onto the substrate support 106 through a loading port 103, which is obscured by the substrate support 106 in FIG. 1A but can be seen in FIG. 1B. The substrate support 106 is shown in an elevated processing position, but may be vertically traversed by an actuator (not shown) to a loading position below the processing position to allow lift pins 105 to contact the lower dome 114, passing through holes in the substrate support 106 and the central shaft 132, and raise the substrate 108 from the substrate support 106. A robot (not shown) may then enter the process chamber 100 to engage and remove the substrate 108 therefrom though the loading port 103. The substrate support 106 then may be raised up to the processing position to place the substrate 108, with its device side 116 facing up, on a front side 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100. The substrate support 106 is supported by the central shaft 132, which moves the substrate 108 in an up and down direction 134 during loading, unloading, and processing of the substrate 108. The substrate support 106 may be formed from silicon carbide or graphite coated with silicon carbide to absorb radiant energy from the lamps 102 and conduct the radiant energy to the substrate 108.

In general, the upper dome 128 and the lower dome 114 are typically formed from an optically transparent material such as quartz. The upper dome 128 and the lower dome 114 are thin to minimize thermal memory, typically having a thickness between about 3 mm and about 10 mm, for example about 4 mm. The thickness and the degree of curvature of the upper dome 128 may be configured to provide a flatter geometry for uniform flow uniformity in the process chamber. Alternatively, the upper dome 128 or lower dome 114 may not necessary be a dome shape, but rather can be made flat. The upper dome 128 may be thermally controlled by introducing a thermal control fluid, such as a cooling gas, through an inlet portion 126 into a thermal control space 137, and withdrawing the thermal control fluid through an exit portal 131. In some embodiments, a cooling fluid circulating through the thermal control space 136 may reduce deposition on an inner surface of the upper dome 128.

One or more lamps, such as an array of lamps 102, can be disposed adjacent to and beneath the lower dome 114 in a specified, optimal desired manner around the central shaft 132 to heat the substrate 108 as the process gas passes over, thereby facilitating the deposition of a material onto the upper surface of the substrate 108. In various examples, the material deposited on the substrate 108 may be a group III, group IV, and/or group V material, or may be a material including a group III, group IV, and/or group V dopant. For example, the deposited material may include gallium arsenide, gallium nitride, or aluminum gallium nitride. In some examples, the material deposited on the substrate 108 may include metal or dielectrics.

A circular shield 167 may be optionally disposed around the substrate support 106 and coupled to sidewall of the chamber body 101. The shield 167 prevents or minimizes leakage of heat/light noise from the lamps 102 to the device side 116 of the substrate 108 in addition to providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

A reflector 122 may be optionally placed outside the upper dome 128 to reflect light that is radiating off the substrate 108 back onto the substrate 108. The reflector 122 may be secured to the upper dome 128 using a clamp ring 130. Due to the reflected light, the efficiency of the heating will be improved by containing heat that could otherwise escape the process chamber 100. The reflector 122 can be made of a metal such as aluminum or stainless steel. The reflector 122 can have machined channels (not shown) to carry a flow of a fluid such as water for cooling the reflector 122.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 is located in the processing position, which is adjacent to and at about the same elevation as the process gas inlet 174, allowing the process gas to flow up and round along flow path 173 across the upper surface of the substrate 108. The process gas exits the process gas region 156 (along flow path 175) through a gas outlet 178 located on the opposite side of the process chamber 100 as the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper dome 128, will enable a generally planar, uniform gas flow across the substrate 108.

Purge gas supplied from a purge gas source 162 is introduced to the purge gas region 158 through a purge gas inlet 164 formed in the sidewall of the base ring 136. The purge gas inlet 164 is disposed at an elevation below the process gas inlet 174. If the circular shield 167 is used, the circular shield 167 may be disposed between the process gas inlet 174 and the purge gas inlet 164. In either case, the purge gas inlet 164 is configured to direct the purge gas in a generally radially inward direction. During the film formation process, the substrate support 106 is located at a position such that the purge gas flows down and round along flow path 165 across back side 104 of the substrate support 106. The flowing of the purge gas is intended to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber through the gas outlet 178 located on the opposite side of the process chamber 100 as the purge gas inlet 164.

The processing chamber 100 is provided with a radiation source 186 which emits light or electromagnetic radiation with a wavelength and power selected to photo-dissociate a fluid gaseous or liquid precursor introduced into the processing chamber for deposition of a material layer on the surface of the substrate, as will be discussed below with respect to FIG. 3. The radiation source 186 may be positioned within the processing chamber 100 at any suitable place. For example, the radiation source 186 may be disposed outside the upper dome 128, such as between the upper dome 128 and the reflector 122. The radiation source 186 may be a laser source, a bright light emitting diode (LED) source, a thermal source, or a combination thereof, any of which may be delivered in a pulsed mode or a continuous wave mode. Other types of radiation sources such as an electron beam source, an ion beam source, or a microwave energy source are also contemplated.

In one embodiment, the radiation source 186 uses a laser source. The radiation source 186 may comprise a plurality of lasers. The laser source may comprise a fiber laser, a gas laser, a solid state laser, an excimer laser, a semiconductor laser etc., which may be configurable in an array to emit light at a single wavelength or at two or more different wavelengths simultaneously. Pulsed lasers may be used. Alternatively, the radiation source 186 may be configured to output continuous wave (CW) laser beam or quasi-CW laser beam at high power. The laser energy may range from essentially unimodal energy ($M^2 \approx 1$) to highly modal energy ($M^2 > 30$) having hundreds or thousands of spatial modes. Pulsed lasers may have pulse durations from the femtosecond range to the microsecond range. In one embodiment, four q-switched, frequency-doubled, Nd:YAG lasers emitting 532 nm laser energy between 30 MW and 50 MW in pulses ranging from about 5 nsec to about 30 nsec per pulse with $M^2$ between about 500 and about 1000 may be used.

In another embodiment, the radiation source 186 emits light or electromagnetic radiation in the ultraviolet (UV) range of wavelengths between about 10 nm and about 500 nm, for example between about 190 nm and 365 nm, such as, 193 nm, for example 248 nm, for example 266 nm, for example 355 nm, for example 365 nm, or example 420 nm. In one example, the radiation source 186 may use a bundle of UV fiber lasers producing multi-mode outputs which vary spatially across the produced beam of illumination, to aid in reducing the coherence-related speckle on the target surface (e.g., the light scanning unit 188, as will be discussed below).

In various examples, the light or electromagnetic radiation may be delivered at a power level of at least 1 milliWatts (mW), such as about 10 mW to about 100 kiloWatts (kW), for example about 10 kW to about 80 kW. The light or electromagnetic radiation may be delivered at an energy density of between about 0.1 $J/cm^2$ and about 1.0 $J/cm^2$, for example about 0.2 $J/cm^2$ to about 0.5 $J/cm^2$. The light or electromagnetic radiation may be delivered in a short duration from about 50 microseconds (μsec) to about 1 second. The lasers may be amplified to develop the power levels desired. However, the energy density should be selected to not exceed the damage threshold of the optical component and/or optical coating deposited on the optical components placed along the light path. The energy field applied in the electromagnetic radiation should have spatial standard deviation of intensity that is no more than about 4%, such as less than about 3.5%, for example less than about 3.0%, of the average intensity. In any cases, the light or electromagnetic radiation is delivered at a power level and pulse repetition that is sufficiently enough to photolytically dissociate the precursor fluids at or near the substrate surface while keeping the photofragments of the dissociated precursors from recombining at any given pressure. It is contemplated that solid state lasers such as Nd:YAG, Nd:glass, titanium-sapphire, or other rare earth doped crystal lasers may be used. In such a case, the lasers may be switched, for example by q-switching (passive or active), gain switching, or mode locking, depending upon the process schemes.

The processing chamber 100 is provided with a light scanning unit 188, which may be positioned outside the upper dome 128. The radiation source 186 projects a substantially coherent or incoherent beam of light or electromagnetic radiation onto the light scanning unit 188 in a desired shape of image, such as a square or a rectangular shape that is sufficient to cover a majority portion of the substrate in a longitudinal or transversal direction (x or y direction), or an image with a desired shape that is sufficient to cover the entire substrate, when deflected by the light scanning unit 188. In one embodiment where fiber lasers are used as the radiation source, the fiber lasers may be gathered into a head with a linear orientation, and the light from the fiber lasers may be passed through optical components such as a micro-lens array and/or focusing optics known in the art to homogenize the light into a uniform image onto the light scanning unit 188. The image may be, for example, about 1-5 mm in width and about 320 mm in length, which may vary depending upon the size of the light scanning unit 188. The light scanning unit 188 then deflects the image toward the device side 116 of the substrate 108.

The light scanning unit 188 may be a rotary polygon mirror driven by a motor (not shown). The rotary polygon mirror has a plurality of reflecting facets capable of rotating at a desired speed, such as a speed between about 100 rpm and 10,000 rpm, to scan the line beam across the substrate 108 at or near the surface. The rotation speed should be fast enough to enable a fast refresh radiation onto the precursors so that the photofragments of the dissociated precursors get real illumination of any particular location within a duration of relaxation time. Therefore, recombination of the dissociated precursors is avoided. Each facet of the polygon mirror is generally angled relative to another facet and may have a flat or curved surface. In one example, the light scanning unit 188 is a long cylindrical rotating polygon mirror having about 10 to about 50 flat reflecting facets. While a hexagonal mirror is illustrated, a polygon mirror with more or less sides is also contemplated. The light scanning unit 188 may have a length of about 250 mm to about 450 mm, for example about 320 mm in length, which may vary depending upon the size of the substrate.

In certain embodiments, one or more optical components 190, such as lenses (e.g., beam expander/focuser or a concave cylindrical lens), filters, mirrors, and the like that are configured to shape the electromagnetic energy and project out a line beam in a desired shape that is sufficiently to cover a portion or the entire substrate disposed on a substrate support, may be optionally positioned along the optical path between the light scanning unit 188 and the substrate 108 to increase or enhance the illumination coverage, or adjust the direction of the line beam. The optional optical component 190 has been omitted from FIG. 1B for clarity.

In operation, rotation of the polygon mirror causes the collimated beam of light or electromagnetic radiation from the radiation source 186 to be deflected by one of the mirror's facet and thereby cause the image to scan across the substrate from one side of the substrate 108 to the other in a desired shape of illumination that is sufficiently to cover the substrate surface in a longitudinal or transversal direction of the substrate. As the polygon mirror is further rotated, the beam line will become incident on a different reflecting facet and a new scan is started along the longitudinal or transversal direction of the substrate until the entire substrate or a desired region of the substrate is illuminated. In this way, the gaseous precursor within the processing chamber, especially those at or near the surface of the substrate 108, will absorb the photon energy from incident beam line at the selected wavelength and power level for effective photodecomposition or photolysis of the component of the gaseous precursor, thereby depositing a material layer on the surface of the substrate.

Figure 2:
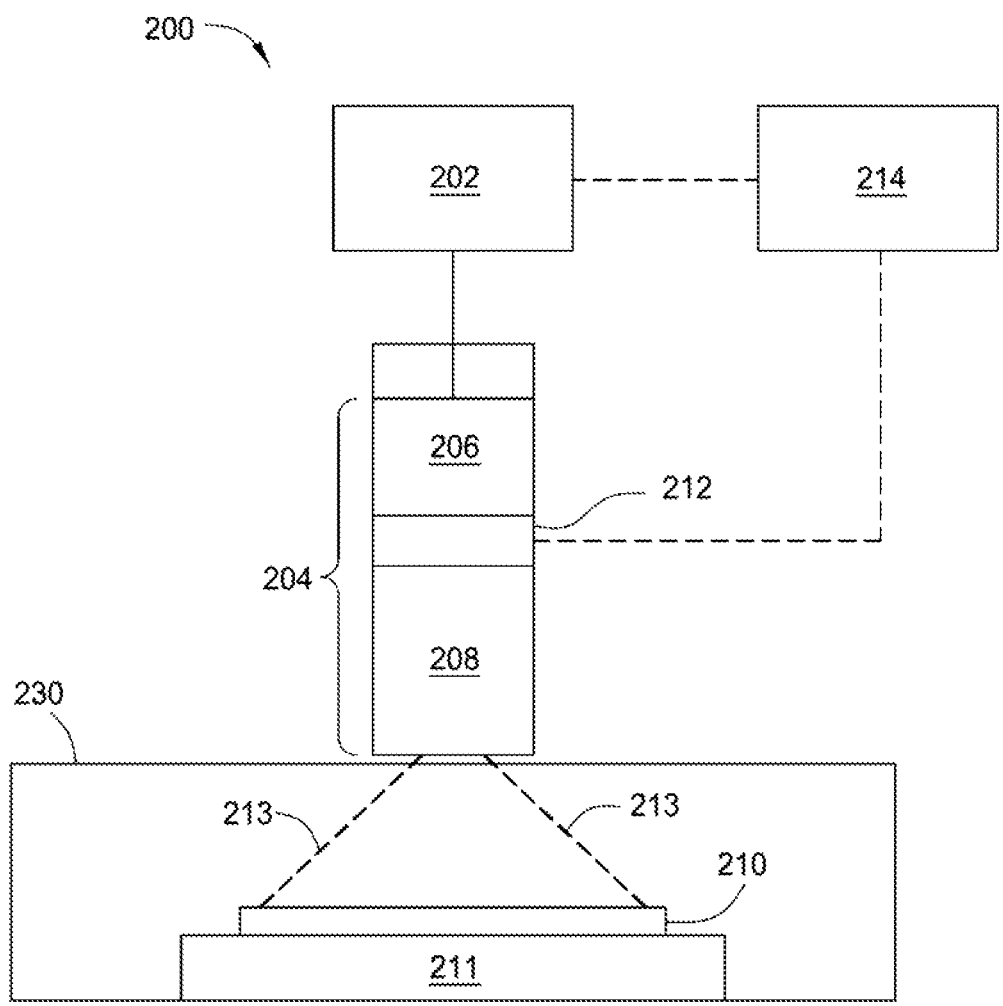
FIG. 2 illustrates a plan view of an alternative embodiment of a radiation source that may be used to practice the present disclosure.

FIG. 2 illustrates a plan view of an alternative embodiment of a radiation source that may be used to practice the present disclosure. In this embodiment, the light scanning unit 188 as shown in FIGS. 1A and 1B is not necessary. The radiation source 204 is positioned within a thermal processing apparatus 200 and is coupled to a power source 202. The radiation source 204 includes an energy generator 206, such as a light source, and an optical component 208. The energy generator 206 is configured to produce electromagnetic energy and direct the electromagnetic energy into the optical component 208. The optical component 208 may include lenses, filters, mirrors, and the like that are configured to shape the electromagnetic energy and project out a beam 213 in a desired shape such as a square or a rectangle that is sufficiently to cover the entire substrate 210 disposed on a substrate support 211, which is positioned within a thermal processing chamber 230. The thermal processing chamber 230 may be the thermal processing chamber 100 as shown in FIGS. 1A and 1B or any deposition chamber suitable for processing a substrate. While the thermal processing apparatus 200 is shown atop the thermal processing chamber 230, it is contemplated that the thermal processing apparatus 200 may be positioned at any desired place to effect the illumination of the substrate 210. For example, the thermal processing apparatus 200 may be positioned adjacent to a sidewall of the thermal processing chamber 230. Suitable optics such as lenses or mirrors may be used to help route and project the image toward the substrate 210.

The energy generator 206 may deliver electromagnetic energy in a pulsed mode or a continuous-wave mode. In one embodiment, the energy generator 206 contains a pulsed laser source, which is configurable to emit light at a single wavelength or at two or more wavelengths simultaneously. The energy generator 206 may be an Nd:YAG laser, with one or more internal frequency converters. However, other types of laser are contemplated and may be utilized. The energy generator 206 may be configured to emit three or more wavelengths simultaneously, or further, to provide a wavelength-tunable output. Useful wavelength may include a wavelength between about 10 nm and about 500 nm, for example between about 190 nm and 420 nm, such as, 193 nm, for example 248 nm, for example 266 nm, for example 355 nm, for example 365 nm. In one example, the laser head used in the energy generator 206 is a Q-switched Nd:YAG laser emitting short, intense pulses light at 355 nm, with pulse duration ranging, for example, from 0.01 microsecond (μsec) to about 100 nanoseconds (nsec), for example about 10 nanoseconds. In one example, the laser head emits 10 kHz laser pulses with 30 nanoseconds pulse durations.

In order to deliver a pulsed laser output, the thermal processing apparatus 200 may contain a switch 212. The switch 212 may be a fast shutter that can be opened or closed in 1 μsec or less. Alternately, the switch 212 may be an optical switch, such as an opaque crystal that becomes clear in less than 1 μsec, such as less than 1 nanosecond, when light of threshold intensity impinges on it. The switch 212 generates pulses by interrupting a continuous beam of electromagnetic energy directed toward the substrate 210. The switch 212 is operated by a controller 214, and may be located inside or outside the energy generator 206. The controller 214 is generally designed to facilitate the control and automation of the processing techniques described herein and typically may include a central processing unit, memory, and support circuits. A program (or computer instructions) readable by the controller 214 determines which tasks are performable on a substrate. For example, a program may be stored on the controller 214 to execute methods described herein.

In an alternative embodiment, the energy generator 206 may be switched by electrical means. For example, the controller 214 may be configured to switch the power source 202 on and off as needed. Alternatively, a capacitor 216 may be provided such that the capacitor 216 is charged by the power source 202 and discharged into the energy generator 206 by virtue of circuitry energized by the controller 214. In embodiments where the switch 212 is an electrical switch, the electrical switch may be configured to switch power on or off in less than about 1 nanosecond.

The radiation source 204 is generally adapted to deliver electromagnetic energy to photolytically dissociate the fluid precursor at or near the surface of the substrate 210 in a manner as discussed below with respect to FIG. 3, for deposition of a material layer on the surface of the substrate. Typical sources of electromagnetic energy include, but are not limited to, an optical radiation source (e.g., laser or flash lamps), an electron beam source, an ion beam source, and/or a microwave energy source. When utilizing a laser, the radiation source 204 may be adapted to deliver electromagnetic radiation in the ultraviolet (UV) wavelengths between about 10 nm and about 420 nm, such as between about 190 nm and 365 nm, for example, 355 nm. The wavelength(s) of the energy source 204 may be tuned so that a significant portion of the emitted electromagnetic radiation is absorbed by the precursor fluids within the thermal processing chamber 230. In various examples of this embodiment, the electromagnetic radiation may be delivered at an average intensity between about 0.2 J/cm$^2$ and about 1.0 J/cm$^2$ in short pulses of duration between about 0.01 microsecond (μsec) and about 100 nanoseconds (nsec), such as between about 5 μsec and about 100 millisecond (msec), for example about 10 μsec to about 3 msec. The repetition rate of the energy pulse may be between about 1 kHz and about 1 MHz, such as between about 10 kHz and about 200 kHz, for example about 30 kHz to about 60 kHz. In any cases, the repetition rate, the power level, and exposure of the electromagnetic radiation should be able to photolytically dissociate the precursor fluids at or near the substrate surface while keeping the photofragments of the dissociated precursors from recombining.

Exemplary Process

Figure 3:
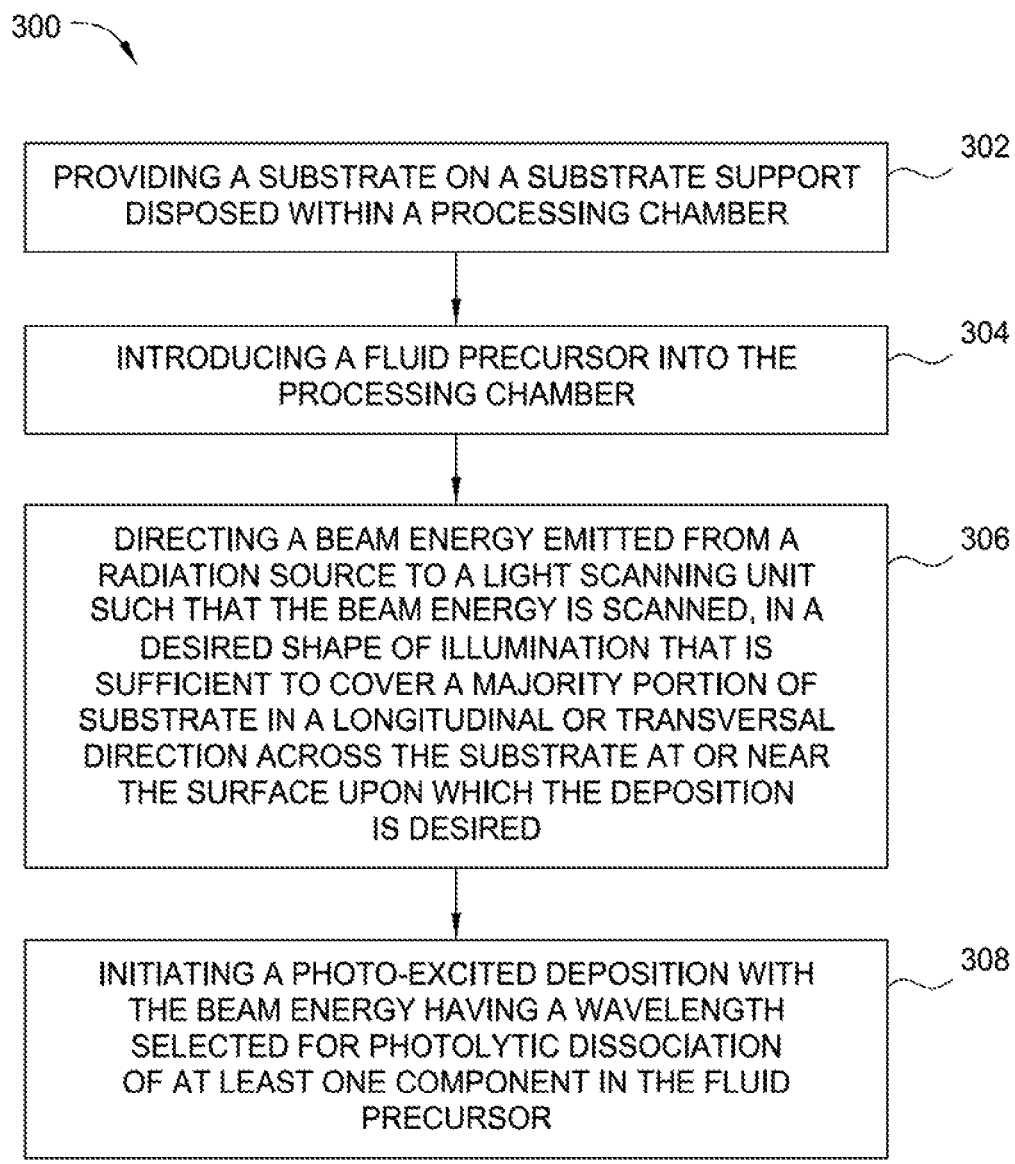
FIG. 3 is a flow diagram of an exemplary method for epitaxial growth of a material layer on a surface of a substrate according to one embodiment of the disclosure.

FIG. 3 is a flow diagram 300 of an exemplary method for epitaxial growth of germanium on a surface of a substrate according to one embodiment of the disclosure. It is contemplated that the disclosure may be equally applicable to other types of material or compound by a different deposition process, such as a chemical vapor deposition (CVD) process, an atomic layer deposition (ALD) process, or an atomic layer epitaxy (ALE) process. The flow diagram 300 described herein may be performed in conjunction with various embodiments discussed above with respect to FIGS. 1A-1B and 2. It should be noted that the number and sequence of operations illustrated in FIG. 3 are not intended to limiting as to the scope of the disclosure described herein, since one or more operations may be added, deleted and/or reordered without deviating from the basic scope of the disclosure.

In general the term "substrate" as used herein refers to objects that can be formed from any material that has some natural electrical conducting ability or a material that can be modified to provide the ability to conduct electricity. Typical substrate materials include, but are not limited to, semiconductors, such as silicon (Si) and germanium (Ge), and mixture thereof, as well as other compounds that exhibit semiconducting properties. Such semiconductor compounds generally include group III-V and group II-VI compounds. Representative group III-V semiconductor compounds include, but are not limited to, arsenides, phosphides (GaP), and nitrides of gallium, aluminum, and indium, and mixtures thereof. Generally, the term "semiconductor substrates" includes bulk semiconductor substrates as well as substrates having layers formed thereon. A "substrate surface," as used herein, refers to any substrate surface upon which a material or energy process may be performed. It is contemplated that a substrate surface may contain features such as transistor junctions, a via, contact, line, or any other interconnect facet, e.g., vertical or horizontal interconnect.

Flow diagram 300 begins at operation 302 by providing a substrate on a substrate support disposed within a processing chamber, for example the processing chamber 100 of FIGS. 1A-1B or the processing chamber 230 of FIG. 2.

At operation 304, a fluid precursor is introduced into the processing chamber. The fluid precursor may be a gaseous precursor or a liquid precursor. Use of gaseous or liquid precursor may have advantages over solid precursor in terms of their relative ease of handling, prompt reaction, tailoring of chemical compositions, and can be applied in large quantities. In either case, a suitable carrier gas such as argon, helium, hydrogen, or nitrogen etc. may be optionally flowed with the gaseous or liquid precursor. In cases where a gaseous precursor is used, the gaseous precursor may be flowed radially across a surface of the substrate in a laminar manner, for example flowing from the process gas inlet 174 along flow path 173 across the upper surface of the substrate 108, as discussed above with respect to FIG. 1A. It is contemplated that the fluid precursor may be introduced in any suitable manner so long as the surface of the substrate is immersed in the fluid precursor.

In this embodiment, a germanium-containing precursor is introduced into the processing chamber to epitaxially grow germanium material on the surface of the substrate. The germanium-containing precursor may be a compound such as germane (GeH$_4$), digermane (Ge$_2$H$_6$), or higher order germanes or germane oligomers, which may be provided with a carrier gas or a dilution gas in a germanium precursor mixture. The carrier gas or dilution gas is typically an inert gas such as argon, helium, nitrogen, hydrogen, or a combination thereof. The germanium-containing precursor may be provided at any concentration in the germanium precursor mixture, and the ratio is typically selected to provide a desired gas flow rate through the processing chamber. For a 300 mm substrate, the flow rate of germanium precursor mixture may be between about 0.1 and 2.0 sLm, of which the germanium-containing precursor from 20% to 90%, for example 70%, by volume.

Optionally, a selectivity control reagent, such as HCl, HF, or HBr, may be provided to the processing chamber during the deposition. The selectivity control agent promotes selective film deposition on the substrate surface, for example a single crystalline silicon surface with features that are covered with dielectric material, such as oxides or nitrides. The selectivity control reagent is typically provided at a volumetric flow rate, and a ratio of the volumetric flow rate of the selectivity enhancing reagent to the volumetric flow rate of the germanium-containing precursor is between about 0.0 and 0.5, such as between about 0.02 and about 0.06, for example about 0.04. The selectivity control reagent may be provided to the processing chamber through a different pathway from the germanium-containing precursor to prevent any premature or side reactions. The selectivity control reagent may also be provided with a dilution or carrier gas.

If desired, a dopant precursor may also be included with the germanium-containing precursor in an amount selected to provide a desired dopant concentration in the film formed on the substrate surface. Dopants such as borane, phosphine, or arsine, and/or dimers, oligomers, and derivatives, such as halides, may be provided.

At operation 306, a beam energy emitted from a radiation source is directed to a light scanning unit such that the beam energy is scanned, in a desired shape of illumination that is sufficient to cover a majority portion of the substrate in a longitudinal or transversal direction (x or y direction), across the substrate at or near the surface upon which the deposition is desired, as discussed above with respect to FIGS. 1A and 1B. Alternatively, the beam energy may be projected out in a line beam having a desired shape such as a square or a rectangle that is sufficiently to cover the entire substrate disposed on a substrate support, as discussed above with respect to FIG. 2. In either case, the beam energy may be selected to provide light characteristics as those discussed above for effective photodecomposition or photolysis of the germanium precursor mixture.

In one embodiment, the energy source is a bundle of fiber lasers emitting laser light in the UV wavelength range, such as between 190 nm and 420 nm, for example, 355 nm. The beam energy may be delivered at a power level of at least 0.1 milliWatts (mW), such as about 10 mW to about 100 kiloWatts (kW), for example about 20 W to about 80 W. In one example, the power level is delivered at an energy density of between about 0.1 J/cm$^2$ and about 1.0 J/cm$^2$, for example about 0.2 J/cm$^2$ to about 0.5 J/cm$^2$, and in a short duration from about 0.01 microseconds (µsec) to about 1 second. In another embodiment where a pulsed laser energy is adapted, the beam energy may be an Nd:YAG laser delivered at an energy density of between about 0.2 J/cm$^2$ and about 1.0 J/cm$^2$ in short pulses of duration between about 0.01 microsecond (µsec) and about 100 nanoseconds (nsec), such as between about 5 µsec and about 100 millisecond (msec), for example about 10 µsec to about 3 msec. The repetition rate of the energy pulse may be between about 1 kHz and about 1 MHz, such as between about 10 kHz and about 200 kHz, for example about 50 kHz to about 100 kHz. Alternatively, the same Nd:YAG laser or UV fiber laser as described herein may be delivered in a continuous mode at a power level of about 20 W to about 80 W, for example, 50 W, depending upon the precursor gas to be dissociated.

At operation 308, the photo-excited deposition is initiated by photolytic dissociation of at least one component in the germanium-containing precursor with the beam energy (deflected by the light scanning unit) having selected wavelengths. In cases where a germanium material is to be grown on the substrate, one may use germane (GeH$_4$) as the germanium-containing precursor. The initial photofragments produced during the photolysis of GeH$_4$ may include GeH$_2$, Ge, and H$_2$ due to two primary dissociation mechanisms as follows:

$$GeH_4 \rightarrow GeH_2 + H_2 \quad (1)$$

$$GeH_2 \rightarrow Ge + 2H_2 \quad (2)$$

The bond dissociation energy of reactions (1) and (2) has been determined to be about 52 kcal/mol (corresponds to 2.25 eV) and about 35 kcal/mol (corresponds to 1.52 eV), respectively. Therefore, photon energies of 3.5 eV at a wavelength of 355 nm, or lower energy photons such as those at 365 nm (3.4 eV) may be advantageous because their energy is sufficiently to break Ge—H bond in the germanium-containing precursor. In one example, the photolytic dissociation of GeH$_4$ may be excited by a pulsed or CW laser light in the UV wavelength range of between 190 nm and 365 nm. In another example, a fiber laser or a bundle of fiber lasers emitting CW or pulsed laser light at a wavelength of 355 nm may be used. The wavelength of the beam energy may vary depending upon the bonds to be dissociated in the precursor medium. Photolytic dissociation of GeH$_4$ may be performed at a high Ge source partial pressure and a low temperature less than about 400° C., for example less than about 200° C. or lower.

While the photolytic dissociation process is described herein as an in-situ process, it is contemplated that the photolytic dissociation of precursors may be performed remotely from the deposition chamber, as long as the photofragments of the dissociated precursors have long enough lifetime and do not recombine too quickly before introducing into the deposition chamber where the deposition is taken place.

Irradiating the germanium-containing precursor at or near the surface of the substrate with UV fiber laser allows a monolayer of crystalline germanium to be epitaxially (either homoepitaxially or heteroepitaxially) grown on the surface of the substrate at higher deposition rate. As the deposition can be effectively achieved through a substantially photolytic, non-thermal dissociation process using UV fiber lasers, the deposition processes may be performed at a lower temperature less than 400° C., for example less than 200° C., or even at room temperature for an epitaxial process, as opposed to conventional epitaxy chamber design which requires higher processing temperature (e.g., above 500° C.) to perform the epitaxy process. With the use of UV fiber laser to photo-dissociate the fluid precursor, it may be possible to eliminate the reflector and/or the lamps that are used in the current epitaxy chamber to enhance thermal processing of the substrate, due to realization of low processing temperature, while still providing an economically feasible film growth rate.

It is contemplated that the concept of the disclosure may be equally applicable to deposition of other materials or semiconductor compounds such as silicon, dielectrics, Group III-V compound semiconductors or Group II-VI compound semiconductors, including binary, ternary, and quaternary alloys thereof, or other semiconductors, including organic semiconductors and magnetic semiconductors. The wavelength, power level, exposure time, or pulse characteristics of the beam energy may be adjusted in order to photolytically dissociate the component in the process precursor(s).

While the foregoing is directed to embodiments of the present disclosure, other and further embodiments of the disclosure may be devised without departing from the basic scope thereof, and the scope thereof is determined by the claims that follow.

The invention claimed is:

1. A substrate processing chamber, comprising:
    a rotatable substrate support having a substrate supporting surface for supporting a substrate to be disposed on the substrate supporting surface, the substrate support operable to vertically move between a loading position and an elevated processing position;
    a gas supply operable to provide a fluid precursor through a gas inlet into the processing chamber, wherein the gas inlet is disposed at a sidewall of the processing chamber at about the same elevation as the substrate support when operated at the elevated processing position, and the gas inlet is configured to flow the fluid precursor radially across a surface of the substrate in a laminar manner;
    a radiation source operable to emit an electromagnetic radiation; and
    a light scanning unit, the light scanning unit operable to direct the electromagnetic radiation from the radiation source to scan across the fluid precursor at or near a surface of the substrate, the electromagnetic radiation having a wavelength and a power level selected for photolytic dissociation of the fluid precursor to deposit a material layer onto the surface of the substrate.

2. The substrate processing chamber of claim 1, wherein the radiation source comprises a laser source, a bright light emitting diode (LED) source, or a thermal source.

3. The substrate processing chamber of claim 1, further comprising:

an optical component disposed along an optical path between the radiation source and the substrate, the optical component operable to shape the electromagnetic energy and project out a line beam in a desired shape to cover a portion or the entire surface of the substrate.

4. A substrate processing chamber, comprising:
an upper dome;
a lower dome opposing the upper dome;
a base ring disposed between the upper dome and the lower dome, the upper dome, the base ring and the lower dome defining an internal region therein;
a rotatable substrate support disposed within the internal region;
a gas outlet disposed at a sidewall of the base ring;
a gas inlet disposed at the sidewall of the base ring opposing the gas outlet, the gas inlet operable to flow a fluid precursor in a laminar manner radially across a top surface of a substrate to be disposed on the substrate support;
a radiation source operable to emit an electromagnetic radiation; and
a rotary light scanning unit having a plurality of reflecting facets, the rotary light scanning unit is operable to direct the electromagnetic radiation from the radiation source to scan across the fluid precursor at or near the top surface of the substrate, the electromagnetic radiation having a wavelength and a power level selected for photolytic dissociation of the fluid precursor to form a material layer onto the surface of the substrate.

5. The substrate processing chamber of claim 4, wherein the upper dome and the lower dome are formed of quartz.

6. The substrate processing chamber of claim 4, further comprising:
an optical component disposed along an optical path between the radiation source and the substrate support, the optical component is operable to shape the electromagnetic energy and project out a line beam.

7. The substrate processing chamber of claim 4, wherein the radiation source comprises a laser source or a bright light emitting diode (LED) source.

8. The substrate processing chamber of claim 4, wherein the rotatable substrate support is operable to move vertically.

9. The substrate processing chamber of claim 4, further comprising:
an array of heating lamps disposed below the lower dome.

10. The substrate processing chamber of claim 4, wherein the radiation source is configured to deliver the electromagnetic radiation in a pulsed mode with a pulse duration of about 0.01 microsecond (psec) to about 100 millisecond (msec) and an energy density ranging from 0.1 $J/cm^2$ to about 1.0 $J/cm^2$.

11. A substrate processing chamber, comprising:
a top, a bottom, and a sidewall disposed between the top and the bottom, the top, the bottom and the sidewall defining an internal region therein;
a rotatable substrate support disposed within the internal region;
a gas inlet disposed at the sidewall, the gas inlet is operable to flow a fluid precursor radially across a surface of the substrate support in a laminar manner;
a radiation source operable to emit an electromagnetic radiation; and
a light scanning unit having a plurality of reflecting facets, the light scanning unit is operable to direct the electromagnetic radiation from the radiation source to scan across the fluid precursor adjacent the surface of the substrate support, the electromagnetic radiation having a wavelength and a power level selected for photolytic dissociation of the fluid precursor to form a material layer.

12. The substrate processing chamber of claim 11, further comprising:
an optical component disposed along an optical path between the radiation source and the substrate support, the optical component operable to shape the electromagnetic energy and project out a line beam.

13. The substrate processing chamber of claim 11, wherein the radiation source comprises a laser source or a bright light emitting diode (LED) source.

* * * * *